United States Patent
Smith et al.

(10) Patent No.: US 6,713,402 B2
(45) Date of Patent: Mar. 30, 2004

(54) METHODS FOR POLYMER REMOVAL FOLLOWING ETCH-STOP LAYER ETCH

(75) Inventors: Patricia Beauregard Smith, Colleyville, TX (US); Heungsoo Park, McKinney, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/161,502

(22) Filed: May 31, 2002

(65) Prior Publication Data
US 2003/0224595 A1 Dec. 4, 2003

(51) Int. Cl.[7] .................................... H01L 21/302
(52) U.S. Cl. ........................... 438/710; 438/738
(58) Field of Search .................. 438/710, 725, 438/624, 786, 798, 622, 597, 637, 706; 315/111.51

(56) References Cited

U.S. PATENT DOCUMENTS

| 5,705,435 | A | * | 1/1998 | Chen ............................ 438/8 |
| 5,723,383 | A | * | 3/1998 | Kosugi et al. .............. 438/719 |
| 5,741,626 | A | * | 4/1998 | Jain et al. ................... 430/314 |
| 5,773,201 | A | * | 6/1998 | Fujimura et al. ........... 430/329 |
| 5,877,075 | A | * | 3/1999 | Dai et al. .................... 438/597 |
| 6,251,771 | B1 | | 6/2001 | Smith et al. |
| 6,277,733 | B1 | | 8/2001 | Smith |
| 6,323,121 | B1 | | 11/2001 | Liu et al. |
| 6,342,446 | B1 | | 1/2002 | Smith et al. |

* cited by examiner

Primary Examiner—John F. Niebling
Assistant Examiner—Olivia T. Luk
(74) Attorney, Agent, or Firm—Jacqueline J. Garner; W. James Brady III; Frederick J. Telecky, Jr.

(57) ABSTRACT

Cleaning methods are disclosed for removing sidewall polymers from interconnect vias or trenches, wherein a wafer is exposed to a plasma comprising hydrogen and an inert gas in a plasma cleaning chamber following etch-stop etching.

28 Claims, 10 Drawing Sheets

METHODS FOR POLYMER REMOVAL FOLLOWING ETCH-STOP LAYER ETCH

FIELD OF INVENTION

The present invention relates generally to semiconductor devices and more particularly to methods for removing polymer residue during the fabrication of interconnect layers in semiconductor devices.

BACKGROUND OF THE INVENTION

In the manufacture of semiconductor products such as integrated circuits, individual electrical devices are formed on or in a semiconductor substrate, and are thereafter interconnected to form electrical circuits. Interconnection of these devices within an integrated circuit is typically accomplished by forming a multi-level interconnect network in layers formed over the electrical devices, by which the device active elements are connected to one another to create the desired circuits. Individual wiring layers within the multi-level network are formed by depositing an insulating or dielectric layer over the discrete devices or over a previous interconnect layer, and patterning and etching cavities such as vias and trenches. Conductive material, such as copper is then deposited into the cavities and the wafer is planarized using chemical mechanical polishing (CMP) to form an interconnect structure.

Typical interconnect structures are fabricated using single or dual damascene processes in which trenches and vias are formed (etched) in a dielectric layer. Copper is then deposited into the trenches and vias and over the insulative layer, followed by CMP planarization to leave a copper wiring pattern including the desired interconnect metal inlaid within the dielectric layer trenches. The process may be repeated to form further interconnect layers or levels by which the desired circuit interconnections are made in a multi-level interconnect network.

Etch-stop layers are often formed beneath the dielectric material layers to provide controlled stopping of the via and/or trench formation etch processes. Silicon nitride (SiN) is typically employed as an etch stop material, although recently silicon carbide (SiC) has also been used for etch-stop layers in interconnect processing. Diffusion barriers are often formed in the damascene cavities prior to deposition of copper to mitigate diffusion of copper into the dielectric material. Such barriers are typically formed using conductive compounds of transition metals such as tantalum nitride, titanium nitride, and tungsten nitride as well as the various transition metals themselves. Conductive metals, such as aluminum, copper, or the like are then used to fill the cavities after barrier layer formation, where copper is gradually replacing aluminum to improve the conductivity of the interconnect circuits.

To reduce or control RC delay times in finished semiconductor products, recent developments have focused on low dielectric constant (low-k) dielectric materials for use between the metal wiring lines, in order to reduce the capacitance therebetween and consequently to increase circuit speed. Examples of low-k dielectric materials include spin-on-glasses (SOGs), as well as organic and quasi-organic materials such as organo-silicate-glasses (OSGs), for example, having dielectric constants (k) as low as about 2.6–2.8, and ultra low-k dielectrics having dielectric constants below 2.5. OSG materials are low density silicate glasses to which alkyl groups have been added to achieve a low-k dielectric characteristic. This class of materials includes, for example, polysilsesquioxanes, such as HSQ (hydrogen silsequioxane), MSQ (methyl silsequioxane), and fluorinated silica glasses (FSGs). Totally organic, non silicaceous materials such as fluorinated polyarylene ethers, are seeing an increased usage in semiconductor processing technology because of their favorable dielectric characteristics and ease of application.

Single and dual damascene processes using OSG, FSG, or ultra low-k dielectric materials, SiC materials, and copper fill metals can thus be employed to increase speed, reduce cross talk, and reduce power consumption in modern high-speed, high-density devices. However, incorporating these newer materials into workable semiconductor fabrication processes presents additional challenges. Etch processes used to remove the etch-stop material beneath the dielectric layer or layers often leave polymer residue on the dielectric sidewalls and the bottom of the trench or via cavities, which must be cleaned or removed prior to barrier formation and filling.

This residual polymer, if left uncleaned, causes a high resistance interface between underlying conductive features and the deposited fill or barrier material, thus exacerbating RC delays. However, the cleaning process itself must not corrode or damage the underlying conductive feature to which connection is to be made. Further, the cleaning process should not change the dimensions of the cavities. Wet cleaning processes have been used in the past to remove polymers formed on oxide type dielectric sidewalls when etching through SiN type etch-stop layers. However, the recent introduction of OSG and other low-k dielectric materials in combination with SiC etch-stop materials and copper fill materials has rendered previous cleaning processes ineffective in removing polymers from OSG and other low-k dielectric sidewalls. Thus, there is a need for improved cleaning techniques by which etch-stop etch polymer residue can be cleaned or removed from interconnect structure cavities without adversely impacting device dimensions or performance.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present one or more concepts of the invention in a simplified form as a prelude to the more detailed description presented later.

The invention relates to cleaning methodologies for removing polymer from cavities such as trenches or vias during formation of interconnect structures in the manufacture of integrated circuits on a semiconductor wafer. The invention may be employed as part of a single or dual damascene interconnect process used to interconnect electrical devices formed on or in the wafer without adversely affecting dimensions thereof. In one particular application, the invention is used to remove polymer from cavities formed in OSG or low-k dielectric materials following etching of SiN or SiC type etch-stop layers to expose underlying conductive features, without significantly changing the critical dimensions of the cavities.

One aspect of the invention involves removing polymer from sidewalls in a cavity after an etch-stop etch process using a plasma comprising hydrogen or other hydrogen containing gas, and argon, helium, neon, xenon or other inert gas. When used in association with OSG type dielectrics, the cleaning plasma is nitrogen-free so as to facilitate subsequent patterning of the OSG dielectric material. In one implementation, following etch-stop etching in an etcher tool, the wafer is transferred to a plasma cleaning tool for exposure to the cleaning plasma. The cleaning plasma process removes the polymeric residue remaining from the etch-stop etch process without noticeable change in the cavity critical dimensions. The employment of hydrogen in the plasma provides a reducing chemistry, which preserves the conductivity of the exposed copper by reducing the oxygen content of portions thereof that may have oxidized. In addition, the hydrogen content in the cleaning plasma may advantageously passivate the copper against contamination from subsequent exposure to air.

To the accomplishment of the foregoing and related ends, the following description and annexed drawings set forth in detail certain illustrative aspects and implementations of the invention. These are indicative of but a few of the various ways in which the principles of the invention may be employed. Other aspects, advantages and novel features of the invention will become apparent from the following detailed description of the invention when considered in conjunction with the drawings.

DETAILED DESCRIPTION OF THE INVENTION

Figure 1:
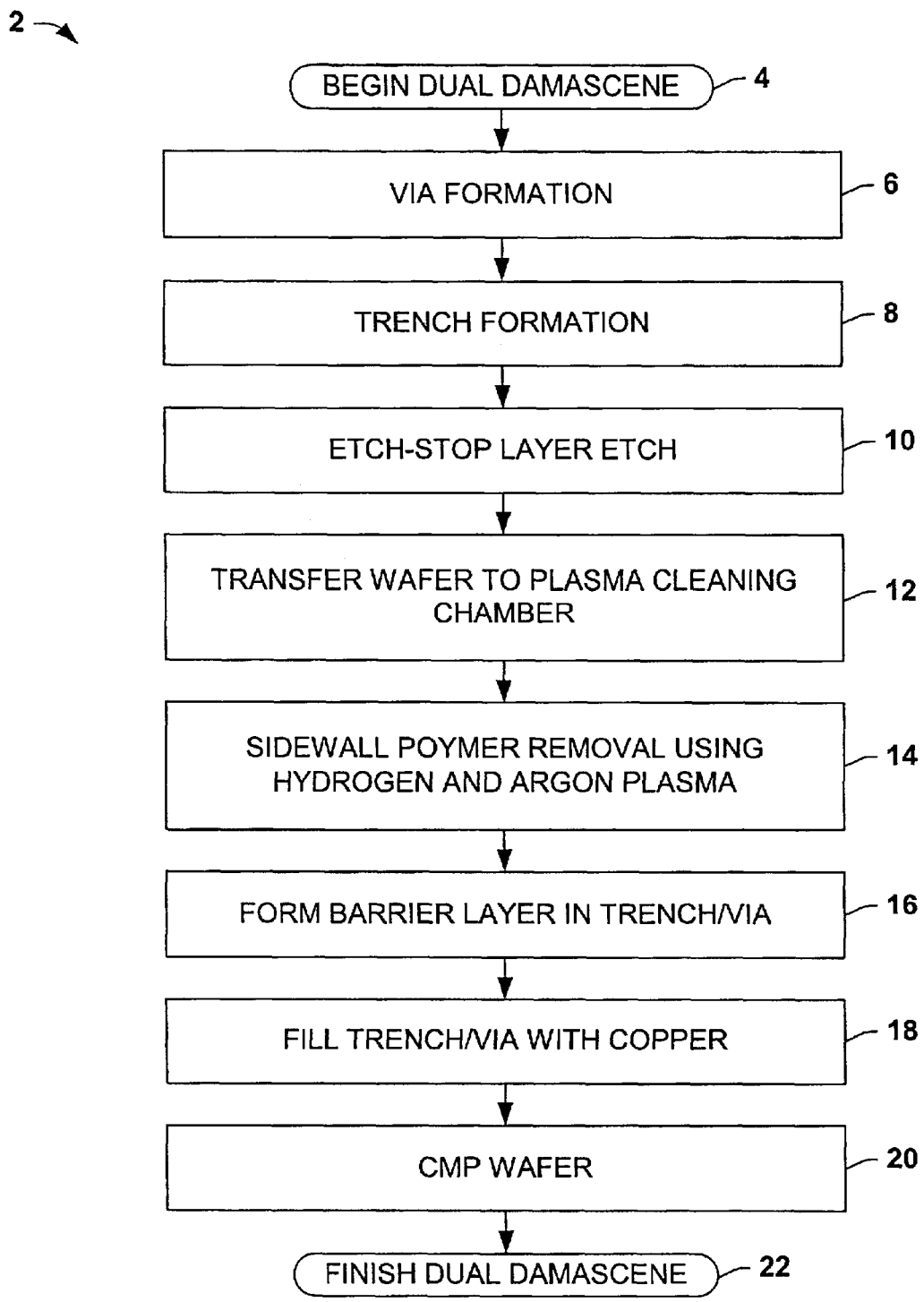
FIG. 1 is a flow diagram illustrating an exemplary method of removing polymeric residue from a trench or via following an etch-stop etch process in accordance with the present invention.

The present invention will now be described with reference to the attached drawings, wherein like reference numerals are used to refer to like elements throughout. The invention relates to cleaning techniques for removing residual sidewall polymeric residue from interconnect structures following etch-stop layer etch processing. As illustrated and described hereinafter, the invention may be employed as part of a dual damascene type interconnect process flow during the manufacture of semiconductor devices in a wafer. However, it will be appreciated by those of ordinary skill in the art that one or more aspects of the invention may alternatively be carried out as part of other interconnection processes, such as the formation of vias or trenches in a single damascene flow, or in an alternative dual damascene process flow to the example presented here, or in other integration schemes employing etch stop layers.

Referring initially to FIG. 1, an exemplary dual damascene interconnection method 2 is illustrated for creating interconnect structures in a wafer, wherein the method 2 comprises polymer residue cleaning techniques in accordance with the invention. While the various aspects of the invention are illustrated and described hereinafter in the context of an exemplary dual damascene interconnection process, the invention is applicable to all types of interconnection methodologies employing etch-stop etch processes, where the cleaning techniques of the invention may be employed to remove polymeric residues. For example, the various aspects of the invention may be carried out in association with single damascene, trench-first dual damascene, and other interconnection processes, wherein such alternatives are contemplated as falling within the scope of the claims. In this regard, it will be appreciated that the appended claims are not limited to the specific interconnection processes illustrated and described herein.

In addition, although the method 2 is illustrated and described below as a series of acts or events, it will be appreciated that the present invention is not limited by the illustrated ordering of such acts or events. For example, some acts may occur in different orders and/or concurrently with other acts or events apart from those illustrated and/or described herein, in accordance with the invention. In addition, not all illustrated steps may be required to implement a methodology in accordance with the present invention. Furthermore, the methods according to the present invention may be implemented in association with the processing systems and semiconductor devices illustrated in FIGS. 2 and 3–12, respectively, as well as in association with other systems and devices not illustrated.

Beginning at 4, the method 2 comprises forming a via at 6. For example, a via may be formed at 6 through a hard mask layer, an upper dielectric layer, an upper etch-stop layer, and a lower dielectric layer to expose a portion of a lower etch-stop layer. The via may be formed at 6 using any appropriate techniques as are known, such as by forming a patterned mask of resist material over the hard mask layer and performing one or more patterned etch processes to remove material from portions of the hard mask, upper etch-stop, and upper and lower dielectric layers in a prospective via region of the wafer. In one example, the via formation at 6 comprises a single operation by reactive ion etching (RIE) sequentially through the hard mask layer, the upper dielectric layer, the upper etch-stop layer, and the lower dielectric layer, stopping on the lower etch-stop layer, with etch chemistries (e.g., such as reactant gas mixtures and other etching parameters) being adjusted for each layer to achieve a high etch rate for each layer as it is reached. Alternatively, separate etch processes can be employed for each layer in forming the via at 6.

At 8, a trench is formed through the hard mask layer and the upper dielectric layer, which exposes a portion of the upper etch-stop layer in a prospective trench region, which overlaps the via region. The trench may be formed at 8 by forming a second patterned resist mask exposing the prospective trench region, and performing one or more RIE trench etch processes. With the dual damascene cavity thus formed, an etch-stop etch is performed at 10 to remove a portion of the lower etch-stop layer in the via region, to uncover the conductive feature underlying the etch-stop material. The etch process at 10 may also remove all or some of the exposed portion of the upper etch-stop layer in the remainder of the trench region. As with the above etch processes, the etch-stop etch process at 10 may be carried out using any appropriate etch chemistries as are suitable for a particular device, taking into account the dielectric and etch-stop layer materials, and using any appropriate etching tool or process.

At 12, the wafer is transferred to a plasma cleaning chamber to be subjected to the cleaning process of this invention for the removal of residual polymer from the sidewalls and bottom of the via cavity. At 14, the polymeric residue is removed using a plasma comprising hydrogen ($H_2$) or other gas containing H, and argon (Ar), or other gases such as Ne, He, or Xe. For example, the plasma may be created in the cleaning process chamber at 14 using about 40% to 100% hydrogen, to which the wafer is exposed. In the illustrated implementation, no biasing need be applied to the wafer during the polymer cleaning at 14. However, other implementations are possible within the scope of the invention, for example, wherein the wafer is biased.

In another alternative implementation, the etch-stop layer etch at 10 and the polymer cleaning or removal processing at 14 may be carried out in a single chamber, with or without biasing in the cleaning step 14, wherein the cleaning process employs hydrogen or other gas containing H, as well as one of argon, neon, helium, xenon, or the like. In such a case, the wafer need not be transferred between chambers, and step 12 of the exemplary process 2 may be deleted. In one possible example, the cleaning at 14 (e.g., and optionally the etch-stop etch processing at 10) may be performed in a biasable resist removal plasma system. However, it is noted that while the invention may be successfully implemented using such bias type plasma processing, complications may arise from back sputtering of exposed copper conductive features, which may complicate the process, wherein the other implementations illustrated herein may be more preferable.

The plasma cleaning step at 14 effectively removes the polymer without measurably changing the critical dimensions of the cavity structures, such as the dielectric sidewalls thereof and exposed portions of the underlying conductive features to which connection is to be made. The hydrogen content in the cleaning process at 14 is further advantageous, in that any oxidation occurring in the conductive (e.g., copper) feature exposed at the bottom of the via cavity is effectively reduced at 14. In addition, the hydrogen plasma at 14 has been found to passivate the exposed copper in the via, so as to inhibit contamination from subsequent exposure to air.

It is believed that excited hydrogen neutral atoms break the polymer into gaseous products at 14, which may then be pumped away in the plasma cleaning chamber. In addition, the inventors have appreciated that where OSG type material is used for the upper and/or lower dielectric layers, that the cleaning plasma at 14 is advantageously made nitrogen-free, so as to avoid altering the OSG material. In this regard, the inventors have found that difficulties arise in attempting to pattern OSG material that has been exposed to nitrogen-containing plasma. It is believed that nitrogen gets embedded into the OSG material, such as at the top of the upper dielectric layer, which interacts with photoresist in such a way as to prevent or inhibit subsequent patterning of the OSG material by preventing proper development of the resist.

In addition, the inventors have found that hydrogen and argon in the cleaning plasma advantageously removes the residual polymers without adversely changing critical dimensions of the dielectric sidewalls or other structures, as illustrated and described below with respect to FIGS. 13A–15B. However, the use of other inert gases such as He, Ne or Xe for example, with hydrogen is contemplated as falling within the scope of the present invention. It is noted in this regard that once the etch-stop layer material is removed at 10, copper is exposed at the bottom of the via cavity in a dual damascene process. Were oxygen employed in the subsequent cleaning plasma at 14 formation of a copper-oxide layer may result, which would then have to be removed to ensure good conductivity in the metal line, thus adding additional process steps.

In a process involving OSG or other low-k dielectric materials, copper conductive features, and SiN or SiC etch-stop layer materials, the polymer cleaning plasma at 14 preferably employs at least about 40% hydrogen, such as about 50% or more and about 70% or less hydrogen. In one example particularly suitable for use with OSG dielectrics, the cleaning process at 14 comprises creating a plasma comprising about 60% hydrogen and about 40% argon, and exposing the wafer to the plasma in the process chamber for about 20 seconds or more and about 40 seconds or less. This exemplary process employs a gas flow rate of about 3000 sccm or more and about 4000 sccm or less, a chamber temperature of about 250 degrees C., and a pressure of between about 0.5 and 1.0 torr, such as about 0.7 torr or more and about 0.8 torr or less.

In another possible implementation of the invention, the cleaning at 14 may involve a two step cleaning process. In a first such step, the wafer is subjected to a plasma comprising oxygen ($O_2$) following the etch-stop etch at 10 in order to remove some or all of the polymeric residue. Thereafter, the wafer is exposed to a second plasma comprising hydrogen or other hydrogen-containing gas and an inert gas, such as Ar, He, Ne or Xe, for example. In this implementation, the initial oxygen based plasma at 14 removes some or all of the residual polymer, while the subsequent H/Ar plasma removes any remaining polymer and also operates as a reduction step, to mitigate any oxidation of exposed copper. Such two-step processing at 14 may be carried out in either a single chamber or in two separate chambers within the scope of the invention. In another possible implementation, a single plasma is used, which comprises hydrogen or a hydrogen-containing gas, oxygen, and one of argon, helium, neon, and xenon. In this case, a subsequent exposure to a second plasma need not be performed.

Once the residual polymer is removed at 14, a barrier layer is formed in the trench and via cavities at 16, such as by deposition of TiN or other appropriate barrier materials as are known. The trench and via cavities are then filled with copper or other conductive fill material at 18 and the wafer is planarized using a CMP process at 20 before the dual damascene process 2 ends at 22. Further layers may be formed in the wafer as needed to implement a desired multi-level interconnect structure, for example, by depositing further etch-stop and dielectric layers and repeating the process 2.

Figure 2:
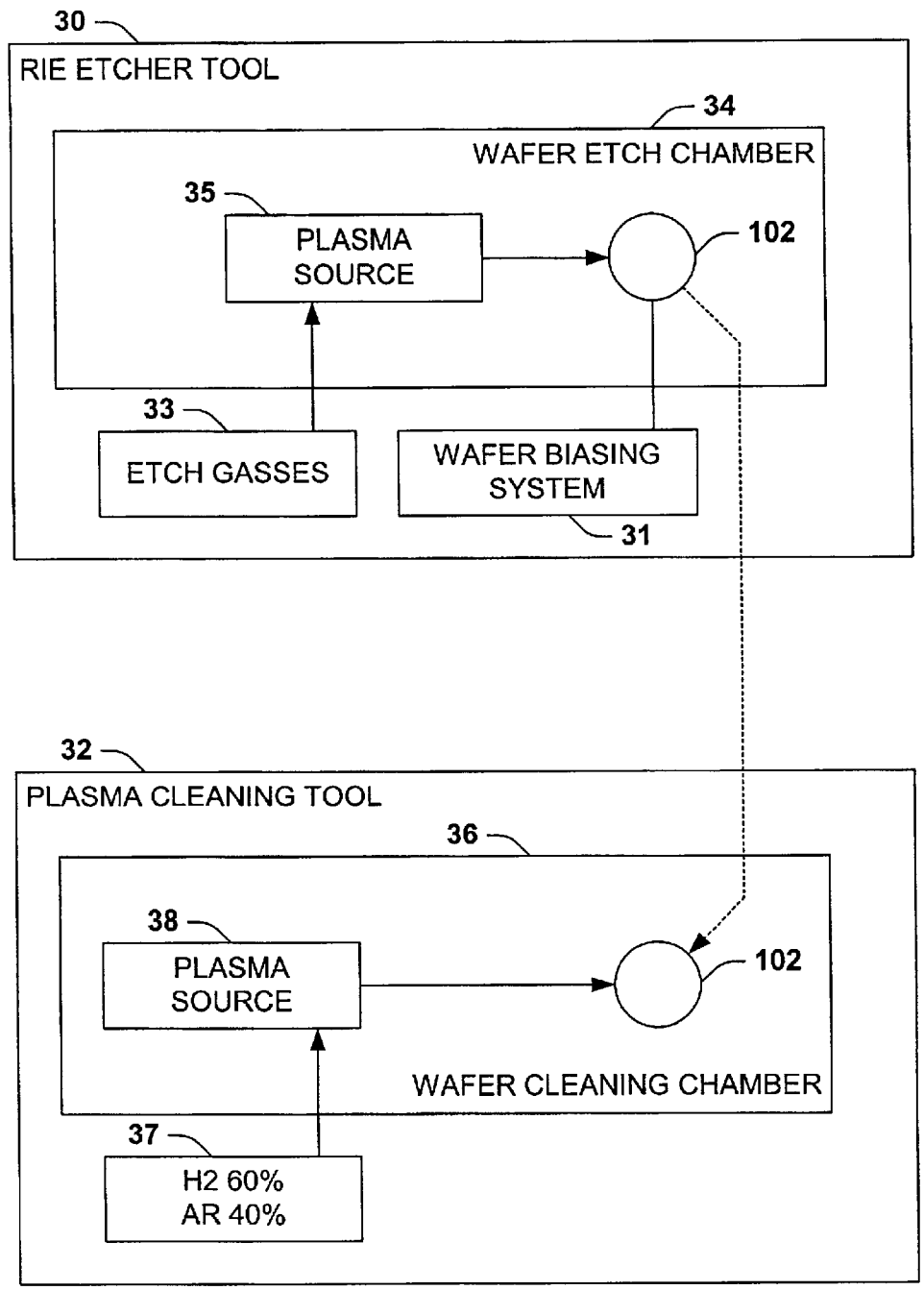
FIG. 2 is a schematic diagram illustrating an exemplary processing system in which various aspects of the invention may be carried out.

The method 2 and other methods in accordance with the present invention may be carried out in a variety of processing systems. One such system is illustrated in FIG. 2, comprising a high density plasma (HDP) RIE etcher tool 30 and a plasma cleaning tool 32 having etching and wafer cleaning chambers 34 and 36 therein, respectively, for processing a wafer 102. In the fabrication of interconnect structures, such as dual damascene interconnect layers, various etch operations may be implemented in the RIE etcher tool 30, with cleaning processes being carried out in the plasma cleaning tool 32. During interconnect processing, one or more RIE etch processes are performed with the wafer 102 in the wafer etch chamber 34, for example, to form vias and trenches as in steps 6 and 8 of the method 2 described above. The wafer 102 is placed in the etch chamber 34 and connected to an RF powered electrode of a biasing system 31, which provides a potential to the wafer 102. Etch gases 33 are supplied to the etch chamber 34 to provide a source of excited gaseous species in the plasma source 35 from which ions are accelerated toward the biased wafer 102. Chemical etching reaction occurs in a direction normal to the surface of the wafer 102, providing generally anisotropic etching in the tool 30.

Prior to barrier formation and filling of the damascene cavities in the wafer 102, the etch-stop material at the bottom of the via and trench cavities is removed in the etcher tool 30. This etch-stop etch process leaves polymeric residue on the dielectric sidewalls and the bottom surfaces of the etched cavities, which must be removed prior to barrier layer deposition. In accordance with the invention, the wafer 102 is transferred from the wafer etch chamber 34 to the cleaning chamber 36 of the plasma cleaning tool 32 following the etch-stop etch process for removal or cleaning of these residual polymers. The plasma cleaning tool 32 provides gas 37 comprising hydrogen and an inert gas such as argon to the chamber 36 and a plasma source 38 is used to create excited neutral species of the process gases in the cleaning chamber 36. The wafer 102 is located downstream from the plasma source, whereupon chemical reaction causes isotropic removal of the residual polymer from the cavity sidewalls and bottom.

The plasma cleaning tool 32 further comprises control apparatus (not shown) for controlling the flow rate of the gas 37, as well as the temperature and pressure in the chamber 36. In one exemplary implementation, the plasma cleaning tool 32 provides the gas 37 comprising about 60% hydrogen and about 40% argon at a flow rate of about 3000 sccm or more and about 4000 sccm or less during polymer cleaning operations following etch-stop etching. A temperature of about 250 degrees C. and a pressure of about 0.5 torr or more and about 1.0 torr or less are maintained in the cleaning chamber 36, wherein the wafer 102 is exposed to the plasma 38 for about 20 seconds or more and about 40 seconds or less. In this regard, the inventors have found the use of the plasma cleaning tool 32 provides removal of the polymeric residue resulting from the etch-stop layer etch process in the etcher tool 30, without significantly impacting the critical dimensions of the damascene interconnect structures. In addition, the cleaning process in the plasma cleaning tool 32 may be nitrogen free, so as to allow subsequent patterning of OSG dielectric layers in the wafer 102.

As discussed above, the plasma cleaning tool 32 may further comprise apparatus for supplying other gases to the cleaning chamber 36. For example, any hydrogen-containing gas may be used for the cleaning process in the chamber 36, and one or more alternative inert gases may be supplied in the tool 32, such as Ar, He, Ne or Xe, for example. In addition, where a two step plasma process is employed for the polymer removal, the tool 32 may provide oxygen to the cleaning chamber 36 for an initial polymer removal step, and thereafter supply hydrogen or hydrogen-containing gas as well as one of Ar, He, Ne or Xe, for a subsequent cleaning/reduction plasma step. In other implementations, the etch-stop etch processing and the polymer cleaning operations may alternatively be performed in a single processing tool or chamber, such as a biasable resist removal plasma system in accordance with the invention. Thus, it will be appreciated that the tools and apparatus illustrated in FIG. 2 are merely examples of equipment with which the processes of the invention may be carried out, and that variants and equivalents thereof are contemplated as falling within the scope of the invention and the appended claims.

Unlike the RIE processing in the etcher tool 30, no biasing is provided to the wafer 102 in the exemplary plasma cleaning chamber 36 during polymer cleaning in the preferred embodiment of the invention. The HDP etcher tool 30 used to perform dielectric and etch-stop layer etching provides biasing to the wafer 102 with the system 31 to increase the physical component of the etch. As a result of the biasing, increased ion flux facilitates increased etch rates and allows etching of deep structures, for example, through dielectric layers. In the plasma cleaning tool 32, on the other hand, there is no biasing system, and consequently, no measurable ion current at the wafer surface. In the plasma cleaning tool 32, moreover, the wafer 102 is located downstream from where the plasma source 38 is located. Thus, the polymer cleaning operation in the plasma cleaning tool 32 is a "downstream" process, wherein the wafer 102 is physically farther from the source 38 than in the etcher tool 30. The inventors have found that the cleaning process in the plasma cleaning tool 32 is thus much less severe than processing in the etcher tool 30, and that there is little or no impact on interconnect structure critical dimensions as a result of the polymer cleaning process in the plasma cleaning chamber 36. However, as noted above, other implementations of the invention are possible wherein the wafer is biased to some degree during plasma polymer removal.

FIGS. 3–12 illustrate an exemplary implementation of the invention in the context of a dual damascene interconnect process. Various processing steps illustrated and described hereinafter may be carried out in accordance with the exemplary method 2 of FIG. 1, in order to remove residual polymer from the wafer 102 following etch-stop etching. In addition, it will be appreciated that certain processes in FIGS. 3–12 may be implemented in accordance with the method 2 of FIG. 1 using the processing equipment illustrated in FIG. 2. Any variety of semiconductor device may be processed in accordance with the present invention, wherein one or more electrical devices (not shown) are fabricated in or on a semiconductor substrate 104 of the wafer 102. Various conductive features are then formed to provide electrical interconnection to one or more device terminals, such as a transistor gate, source, drain, or other active device terminals.

Following device formation, a dual damascene structure is formed in a semiconductor device 102 for filling with copper to form interconnections between electrical devices in an integrated circuit. The illustrated portions of the interconnect process employ upper and lower OSG dielectric layers, and upper and lower SiC etch-stop layers, for use in providing vias and trenches to be filled with copper in prospective trench regions 120 and prospective via regions 121 of the wafer 102. However, it is noted at this point that the invention is not limited to dual damascene interconnect applications or to the illustrated layer materials, and further that the structures illustrated and described hereinafter are not necessarily drawn to scale.

Figure 3:
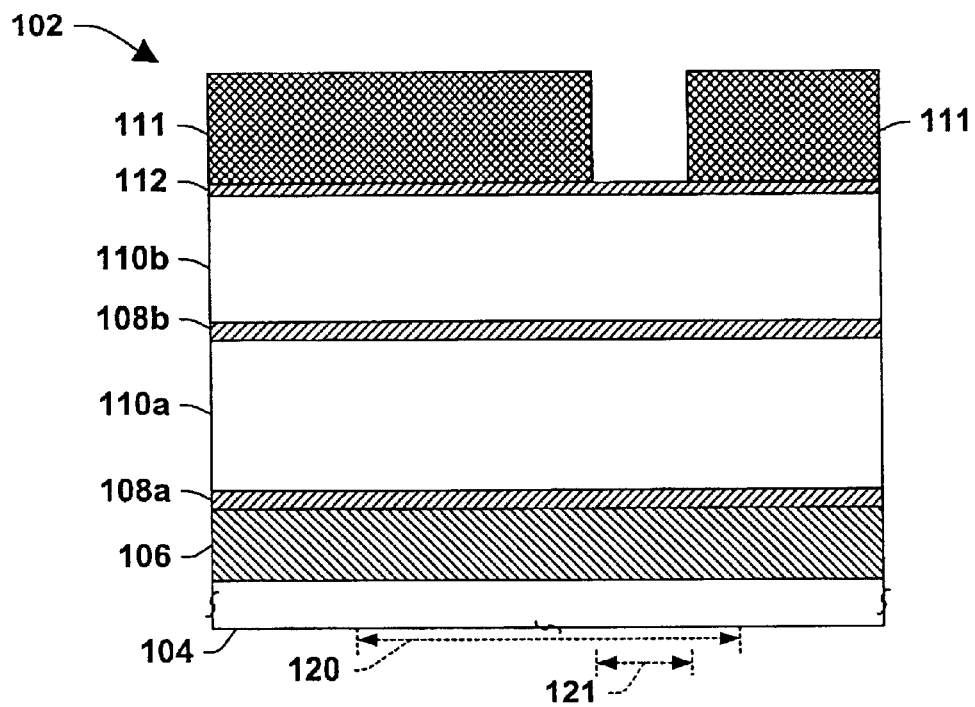
FIG. 3 is a partial cross-sectional side view illustrating an exemplary semiconductor wafer in which a dual damascene interconnect structure is to be formed in accordance with the invention.

FIG. 3 illustrates a semiconductor device or wafer 102 at an intermediate stage of fabrication processing following device formation, wherein a conductive feature 106 is formed over the substrate 104. The above method and other techniques in accordance with the invention may be used to provide electrical connection to any sort of conductive feature, including but not limited to transistor gates, source/drain regions, contacts, and/or filled vias/trenches or other conductive structures in underlying layers in a wafer. For example, the conductive feature 106 may comprise copper formed in a trench of an underlying interconnect layer or level. A lower SiC or SiN layer 108a overlies the conductive feature 106 to act as an etch-stop layer in formation of a prospective via in the region 121. A first or lower dielectric layer 110a, such as formed from OSG, FSG, ultra low-k dielectric materials, or the like, overlies the lower etch-stop layer 108a. A second or upper etch-stop layer 108b is formed over the lower dielectric layer 110a and a second or upper dielectric layer 110b is formed over the second etch-stop layer 108b. An upper hard mask layer 112 overlies the dielectric layer 110b. An initial patterned resist 111 is formed over the hard mask layer 112, exposing a portion thereof in the prospective via region 121.

Figure 4:
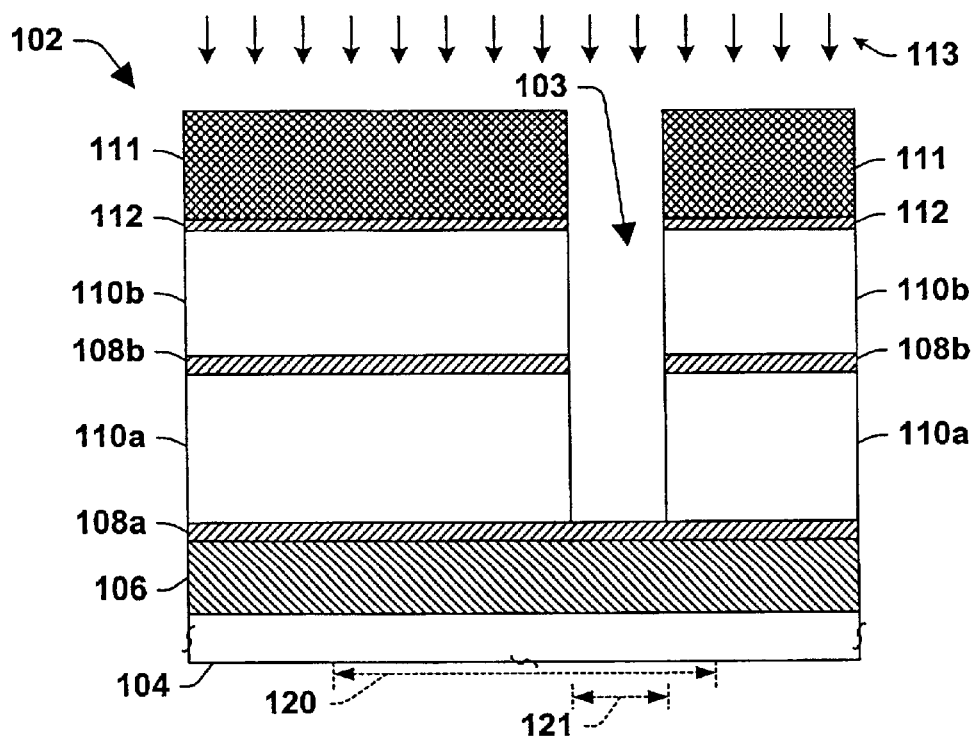
FIG. 4 is a partial cross-sectional side view illustrating a device structure following a via etch process in the wafer of FIG. 3.

In FIG. 4, an RIE etch process 113 is performed to form a via cavity 103 through the layers 112, 110b, 108b, and 110a to expose a portion of lower etch-stop layer 108a in the via region 121. The etch process 113 may be a single-step process or a multi-step process performed in the RIE etcher 30 of FIG. 2, such as one or more patterned etch processes to remove material from portions of the hard mask, upper etch-stop, and upper and lower dielectric layers in the region 121 of the wafer 102. In one example, the process 113 comprises a single operation by reactive ion etching (RIE) sequentially through the hard mask layer 112, the upper dielectric layer 110b, the upper etch-stop layer 108b, and the lower dielectric layer 110a, stopping on the lower etch-stop layer 108a, wherein the etch chemistry is adjusted to achieve a high etch rate for each layer as it is reached. The initial resist 111 is then removed, such as by using a plasma process in the plasma cleaning tool 32 of FIG. 2.

Figure 5:
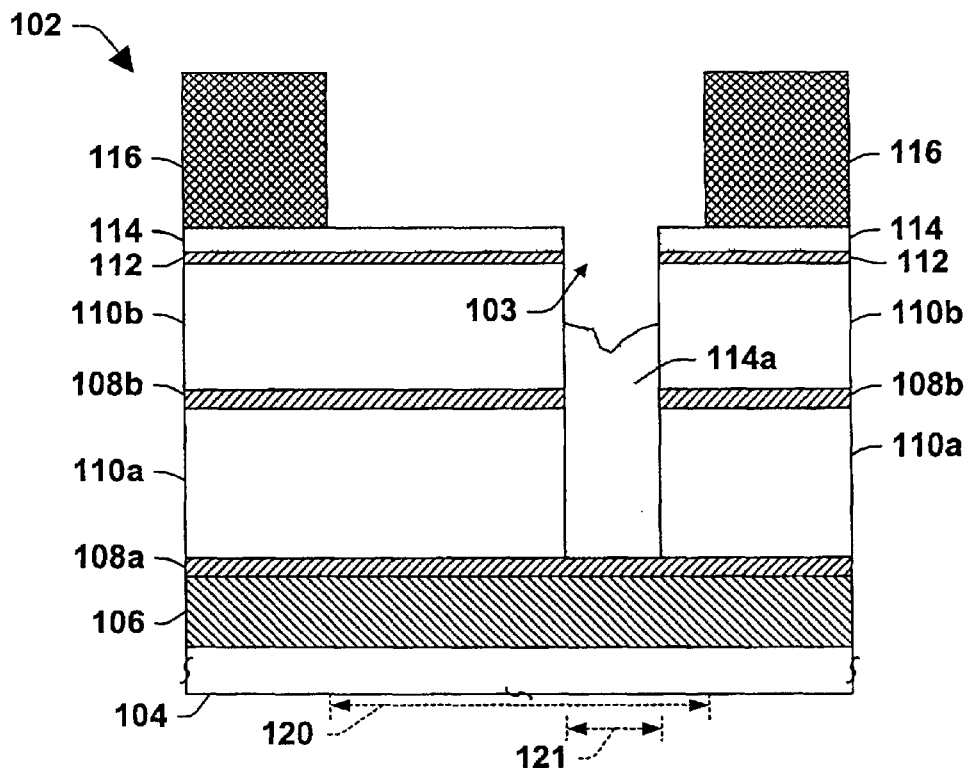
FIG. 5 is a partial cross-sectional side view illustrating a device structure following a trench patterning and BARC layer formation in the wafer of FIGS. 3 and 4.
Figure 6:
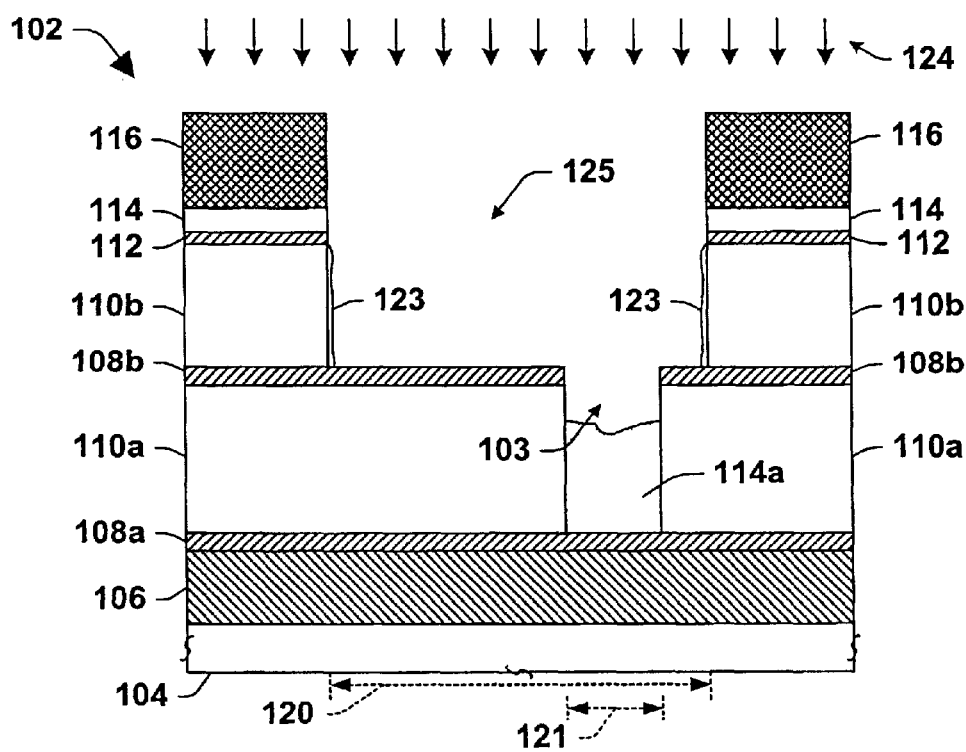
FIG. 6 is a partial cross-sectional side view illustrating a device structure following a trench formation etch process in the device of FIGS. 3–5.
Figure 7:
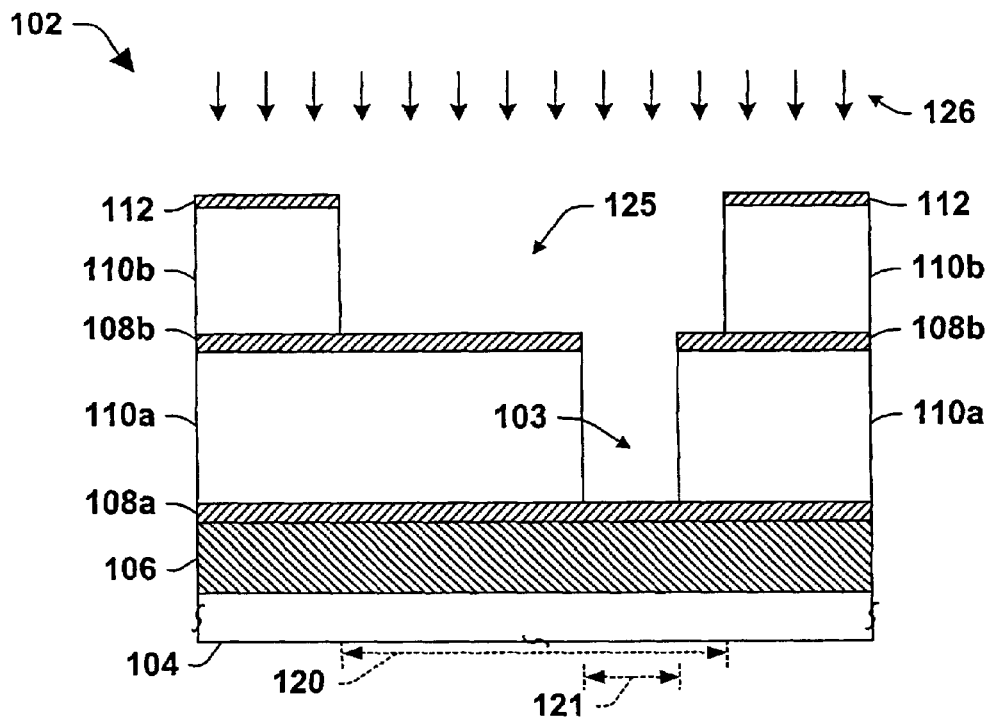
FIG. 7 is a partial cross-sectional side view illustrating a device structure following a cleaning process to remove residue and resist from the device of FIGS. 3–5.

In FIG. 5, a bottom anti-reflective coating (BARC) layer 114 is deposited over the SiC hard mask layer 112, resulting in a portion 114a of BARC material being formed in the bottom of the via cavity 103. A second photoresist layer 116 is then formed and patterned over the BARC layer 114, leaving portions of the BARC layer 114 exposed in a prospective trench region 120 of the wafer 102. In FIG. 6, an RIE trench etch process 124 is performed to remove an exposed portion of the BARC layer 114, the hard mask layer 112, and the upper dielectric layer 110b, stopping on the upper etch-stop layer 108b, in order to form a trench 125. Residue 123 may be formed on the dielectric sidewalls of the trench 125 as a result of the trench etch process 124. In FIG. 7, the residue 123, the remaining resist 116, and the BARC layer 114 are removed along with the remaining portion of the BARC material 114a in the bottom of the via cavity 103, for example, using plasma and/or wet cleaning operations 126. This post-trench etch cleaning operation 126 may be performed in a plasma cleaning tool, such as tool 32 of FIG. 2.

Figure 8:
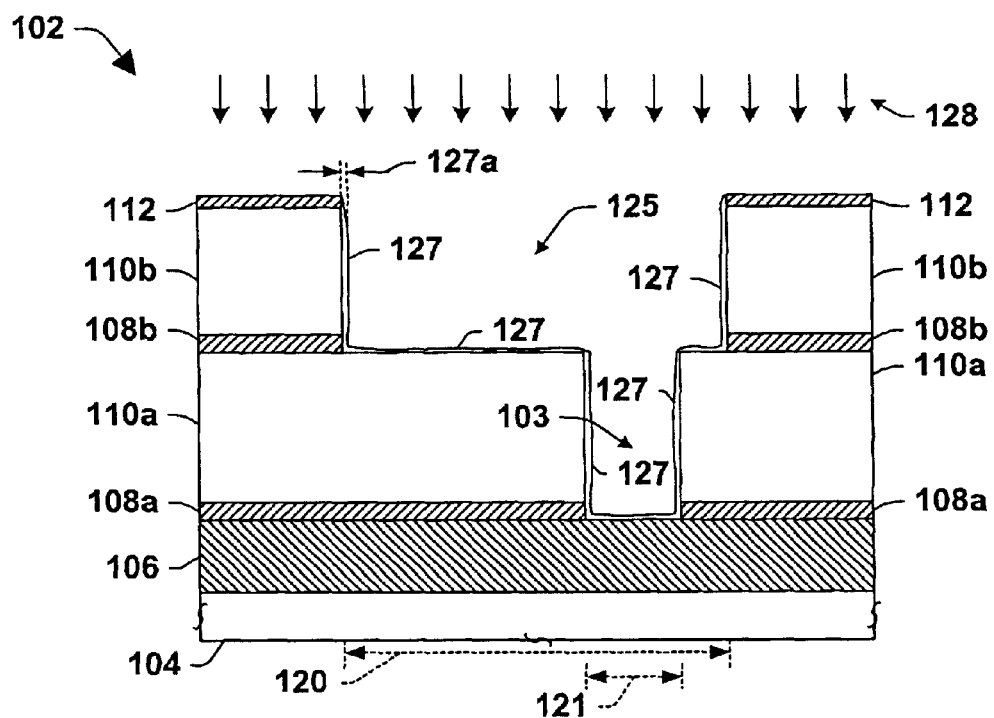
FIG. 8 is a partial cross-sectional side view illustrating a device structure following an etch-stop etch process for exposing a portion of a conductive feature in the via cavity of FIGS. 3–7.

In FIG. 8, the wafer 102 is transferred back to an etch tool (e.g., tool 30 of FIG. 2) where an etch-stop etch process 128 is performed to remove the exposed portion of the lower etch-stop layer 108a, thereby exposing the conductive feature 106 in the via 103. The hard mask layer 112 and/or the upper etch-stop layer 108b may also be fully or partially removed during the etch-stop etch 128, for example, wherein both the hard mask 112 and the etch stop layers 108 are typically formed of the same material (e.g., SiN or SiC) although they are not required to be the same material. The RIE etch-stop etch process 128 has been found to leave a polymeric residue 127 on the sidewalls and lower surfaces of the trench 125 and the via 103, having a thickness 127a, typically less than about 1000 Å, such as about 100–200 Å.

The existence of the polymeric residue 127 is desired during the etch-stop etch process 128, in order to provide protection at the sidewalls of the cavities 103 and 125 during removal of material from the layers 108a and 108b. In this regard, the etch chemistry of the etch-stop etch process 128 is typically adjusted to provide increased etch selectivity between the material of the dielectric layers 110 (e.g., OSG or other low-k dielectric material) and that of the etch-stop layers 108 (e.g., SiN or SiC). However, once the conductive feature 106 has been exposed, the polymeric residue 127 inhibits electrical conduction to the conductive feature 106, causing high resistance interconnection and exacerbating RC delays in the finished circuit. In addition, the presence of such residual polymer 127 may cause degraded adhesion between subsequently deposited barrier material and the sidewalls and lower surfaces in the damascene cavities 103 and 125.

Figure 9:
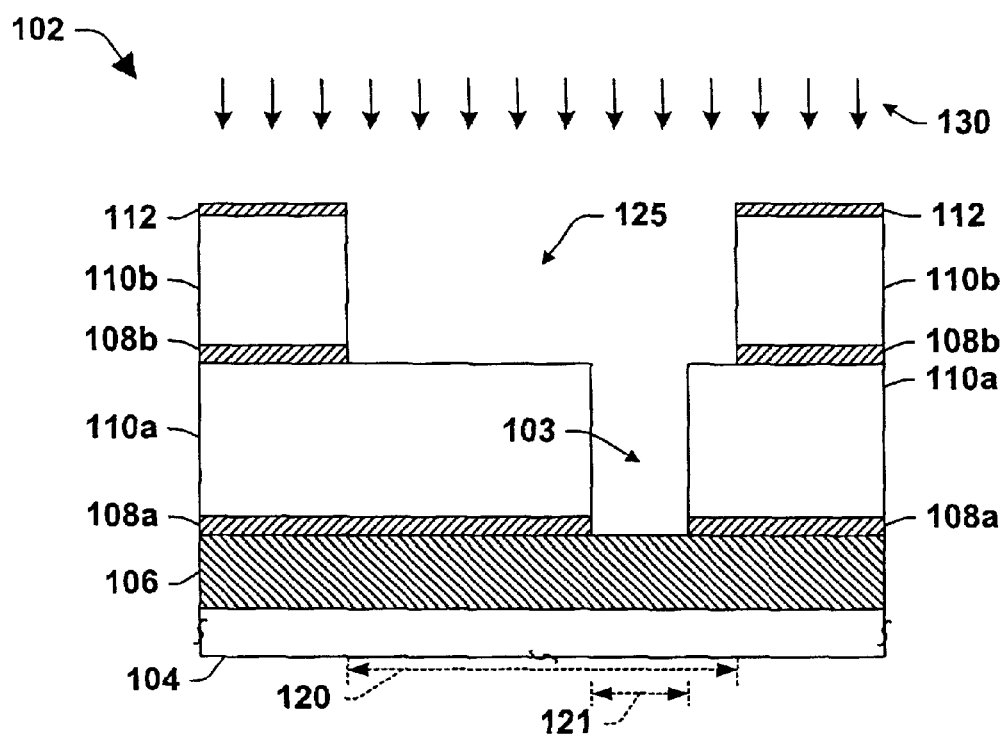
FIG. 9 is a partial cross-sectional side view illustrating a device structure following a cleanup process to remove the residual polymer from the cavity after etch-stop etching in accordance with the present invention.

In FIG. 9, the wafer 102 is transferred from the etch tool to a plasma cleaning tool for removal of the polymeric residue 127 in accordance with the present invention. A polymer cleaning or removal process 130 is performed in the plasma cleaning tool (e.g., tool 32 of FIG. 2), wherein the wafer 102 is exposed to a plasma comprising hydrogen to remove the polymer 127. In one implementation, the process 130 provides a plasma comprising about 60% hydrogen and about 40% argon, which is substantially free of nitrogen so as to avoid problems in subsequently patterning the dielectric material 110.

As illustrated in FIG. 9, as well as FIGS. 13–15 below, the exemplary cleaning process 130 removes the polymer 127 without measurably changing the critical dimensions (CD) of the cavity structures. The process 130, moreover, chemically reduces any metal oxide that may have formed on the exposed conductive feature 106 due to the use of hydrogen. The process 130 additionally passivates the conductive material thereof against contamination from subsequent exposure to air. In one example, the cleaning process 130 comprises exposing the wafer 102 to a plasma comprising about 60% hydrogen and about 40% argon in the plasma cleaning chamber for about 20 seconds or more and about 40 seconds or less. The process 130 may employ a gas flow rate of about 3000 sccm or more and about 4000 sccm or less, a chamber temperature of about 250 degrees C., and a pressure of about 0.5 torr or more and about 1.0 torr or less.

Figure 10:
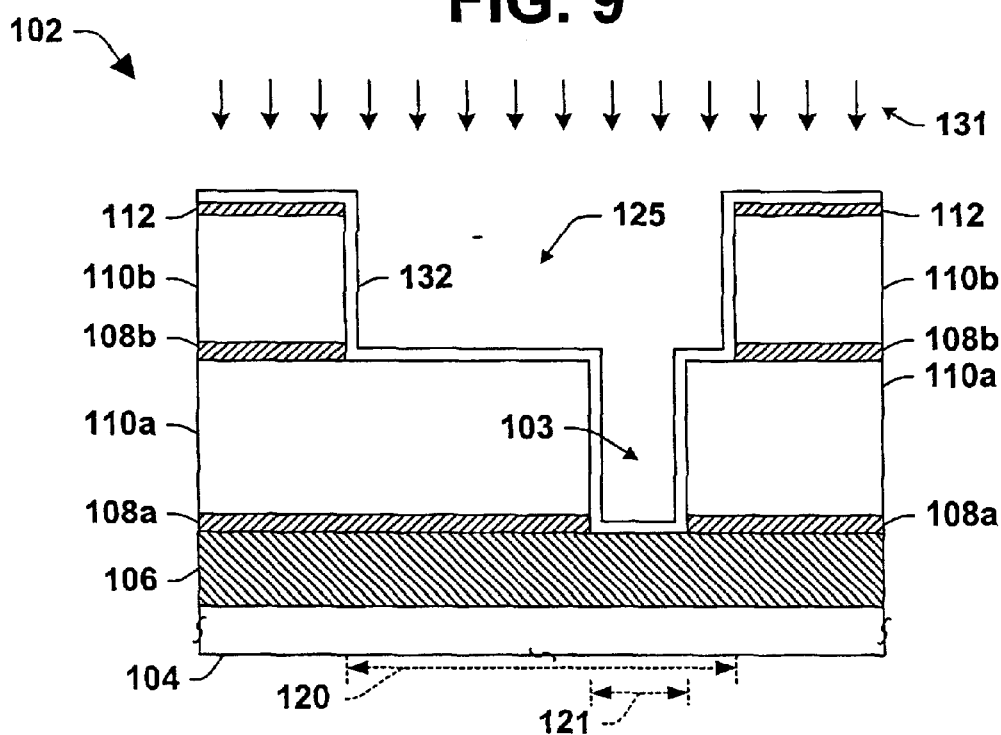
FIG. 10 is a partial cross-sectional side view illustrating a device structure following the formation of a barrier layer in the trench and via cavities of the device of FIG. 9.

In FIG. 10, a deposition process 131 is performed to deposit a diffusion barrier layer 132 over any remaining portions of the hard mask layer 112, the exposed portions of the conductive feature 106 and the lower dielectric layer 110a, and the sidewalls of the via 103 and the trench 125. The diffusion barrier 132 operates to prevent or inhibit diffusion of subsequently deposited copper from the via and trench cavities into the dielectric material in layers 110a and 110b. Any appropriate materials may be used in forming the diffusion barrier, such as TiN, TaN, Ta, Ti, or combinations thereof, or others as are known. A seed copper layer (not shown) may then be deposited over the diffusion barrier 132, in order to facilitate subsequent copper filling of the via 103 and the trench 125.

Figure 11:
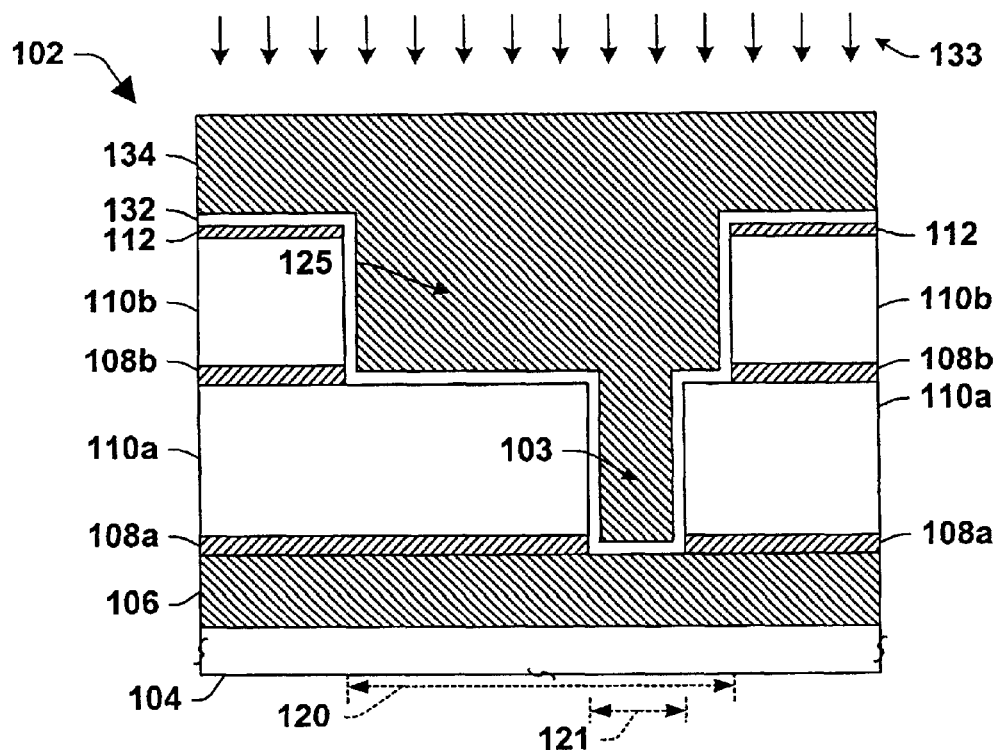
FIG. 11 is a partial cross-sectional side view illustrating a device structure following a deposition process to fill the trench and via cavities of the device of FIG. 10.
Figure 12:
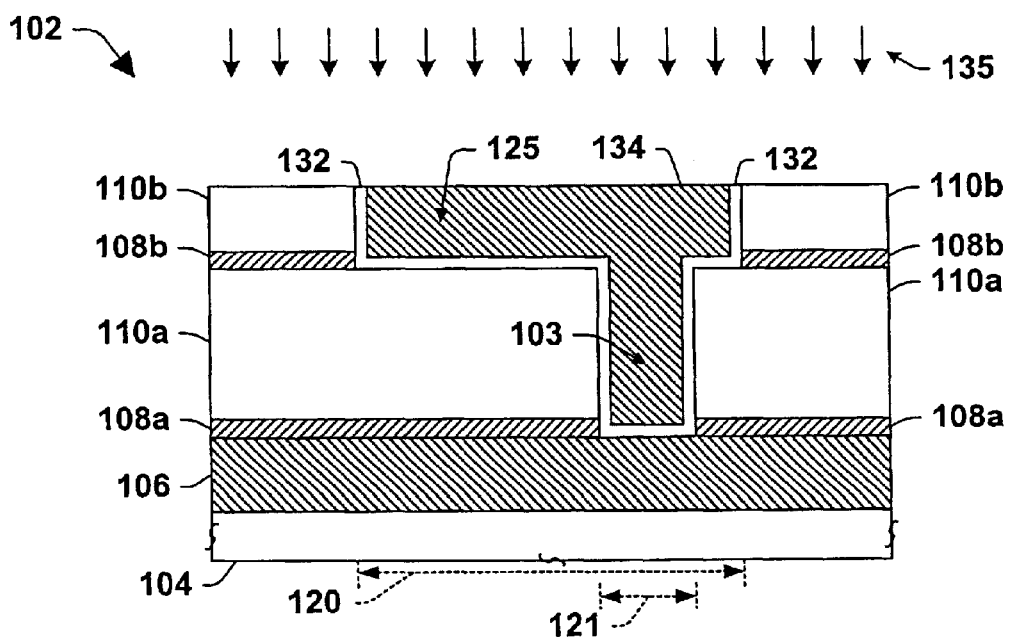
FIG. 12 is a partial cross-sectional side view illustrating a device structure following a CMP process to planarize the device of FIG. 11.

In FIG. 11, an electrochemical deposition (ECD) process 133 is used to deposit a copper layer 134 over the device 102 so as to fill the via and trench cavities 103 and 125, respectively, as well as over the barrier layer 132 above the trench sidewalls. Any appropriate copper deposition process 133 may be employed, which may be a single step or a multi-step process. Thereafter in FIG. 12, a chemical mechanical polishing (CMP) process 135 is employed to planarize the upper surface of the wafer 102, reducing the thickness of the upper dielectric layer 110b, the diffusion barrier 132 and the deposited copper 134 as illustrated. In this manner, the CMP process 135 electrically separates the illustrated cavities 103 and 125 from other such cavities formed in the device 102, whereby controlled connection of the underlying conductive feature 106 with subsequently formed interconnect structures can be achieved.

Figure 13A:
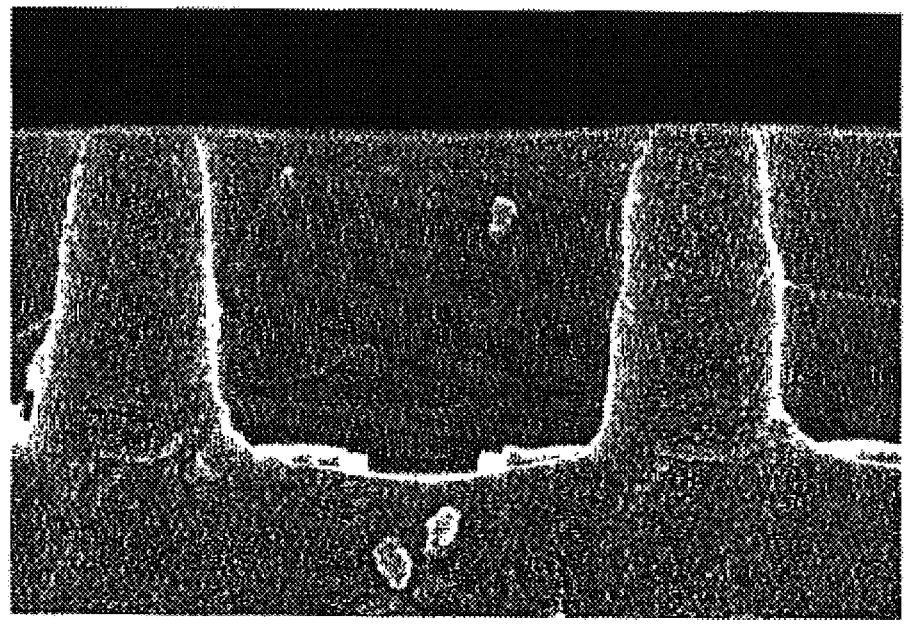
FIGS. 13A and 13B are exemplary side elevation view images of interconnect structure cavities prior to and following the removal of polymeric residue, respectively, using the techniques of the invention.
Figure 13B:
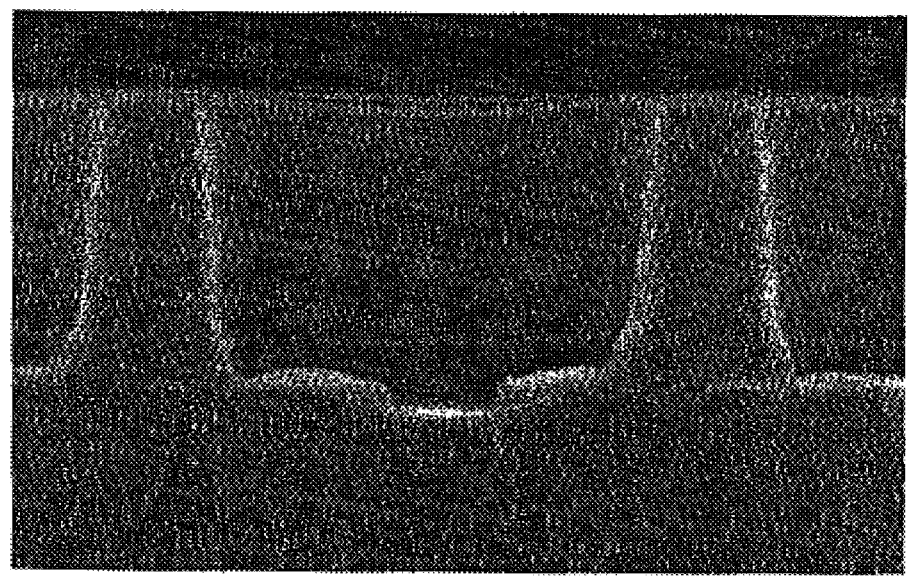
Figure 14A:
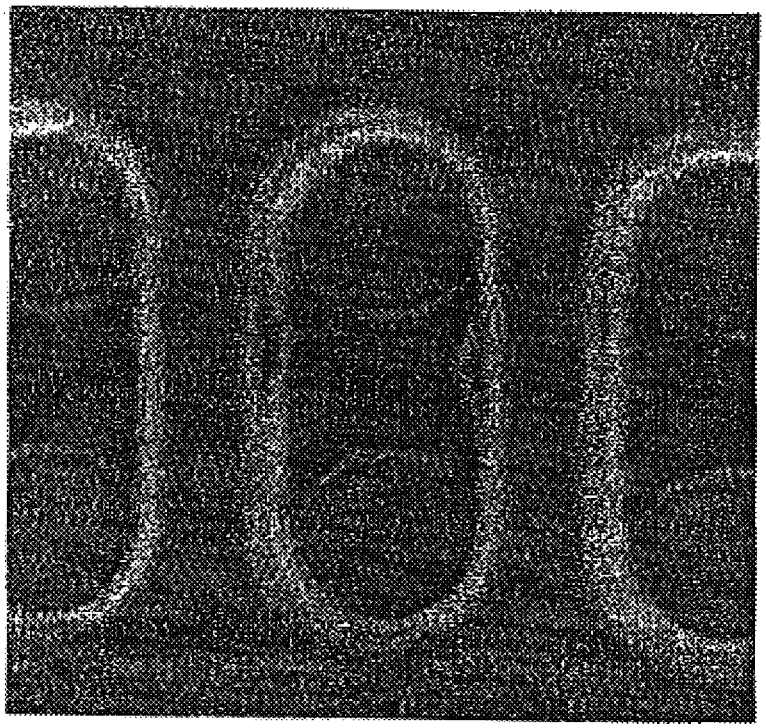
FIGS. 14A and 14B are exemplary top plan view images of interconnect structure cavities prior to and following removal of polymeric residue, respectively, using the techniques of the invention.
Figure 14B:
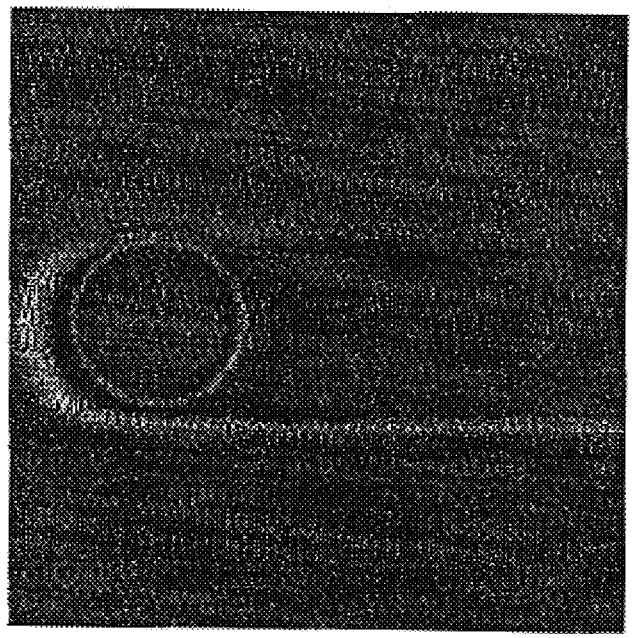
Figure 15A:
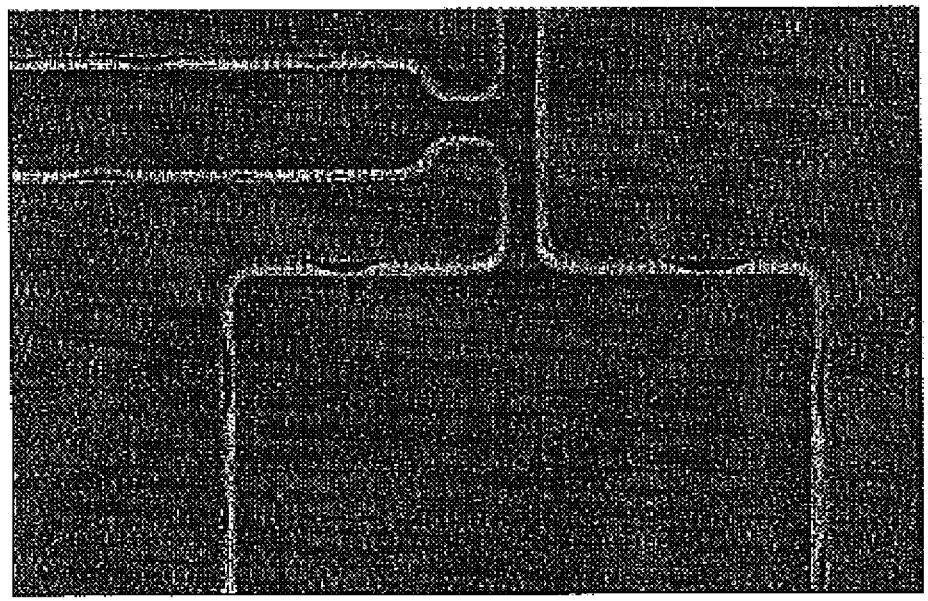
FIGS. 15A and 15B are exemplary top plan view images of interconnect structure cavities prior to and following removal of polymeric residue, respectively, using the techniques of the invention.
Figure 15B:
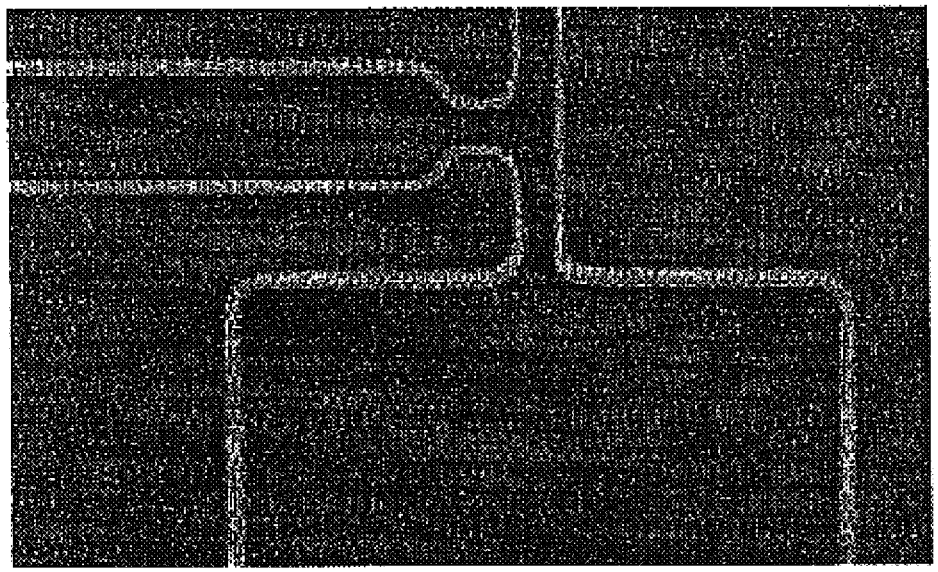

As discussed above, the plasma cleaning processes of the invention advantageously remove polymeric residues resulting from an etch-stop etch process without significantly impacting the critical dimensions of interconnect structure cavities. FIGS. 13–15 illustrate exemplary SEM images of interconnect structures processed in accordance with the invention. FIGS. 13A and 13B provide side elevation view images 200 and 202, respectively, illustrating interconnect structure cavities prior to and following the removal of polymeric residue using the techniques of the invention, respectively. FIGS. 14A and 14B illustrate exemplary top plan view images 210 and 212 of interconnect structure cavities prior to and following the removal of polymeric residue, respectively. FIGS. 15A and 15B provide exemplary top plan view images 220 and 222, respectively, of interconnect structure cavities prior to and following the removal of polymeric residue in accordance with the techniques of the invention.

Although the invention has been illustrated and described with respect to one or more implementations, equivalent alterations and modifications will occur to others skilled in the art upon the reading and understanding of this specification and the annexed drawings. In particular regard to the various functions performed by the above described components (assemblies, devices, circuits, systems, etc.), the terms (including a reference to a "means") used to describe such components are intended to correspond, unless otherwise indicated, to any component which performs the specified function of the described component (e.g., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "including", "includes", "having", "has", "with", or variants thereof are used in either the detailed description and the claims, such terms are intended to be inclusive in a manner similar to the term "comprising."

What is claimed is:

1. A method for creating an interconnect structure associated with a semiconductor wafer, the method comprising:
    forming a cavity in a dielectric layer over the semiconductor wafer to expose a portion of an etch-stop layer underlying the dielectric layer;
    performing an etch-stop etch process to remove the exposed portion of the etch-stop layer in the cavity and to expose a portion of a conductive feature underlying the etch-stop layer; and
    removing polymer from sidewalls in the cavity after the etch-stop etch process using a plasma comprising hydrogen or a hydrogen-containing gas and one of argon, helium, neon, and xenon.

2. The method of claim 1, wherein performing the etch-stop etch process comprises performing an RIE etch in a first process chamber and wherein removing the polymer from the sidewalls in the cavity comprises exposing the wafer to the plasma in a second process chamber.

3. The method of claim 2, wherein the plasma comprises at least about 40% hydrogen or other hydrogen-containing gas.

4. The method of claim 3, wherein the plasma comprises about 50% or more and about 70% or less hydrogen or other hydrogen-containing gas.

5. The method of claim 4, wherein the plasma comprises about 60% hydrogen and about 40% of one of argon, helium, neon, and xenon.

6. The method of claim 1, wherein the etch-stop etch process and removing polymer from the sidewalls are performed in a single process chamber.

7. The method of claim 6, wherein removing polymer from the sidewalls comprises exposing the water to a first plasma comprising oxygen and thereafter exposing the wafer to a second plasma comprising hydrogen or a hydrogen-containing gas and one of argon, helium, neon, and xenon.

8. The method of claim 6, the plasma further comprises oxygen.

9. The method of claim 1, wherein removing polymer from the sidewalls comprises exposing the wafer to a first plasma comprising oxygen and thereafter exposing the water to a second plasma comprising hydrogen or a hydrogen-containing gas and one of argon, helium, neon, and xenon.

10. The method of claim 1, wherein removing polymer from sidewalls comprises creating a plasma in a plasma cleaning chamber using a gas comprising about 80% hydrogen and about 40% argon and exposing the wafer to the plasma in the plasma cleaning chamber.

11. The method of claim 10, wherein the dielectric layer comprises a low-k dielectric material.

12. The method of claim 10, wherein the dielectric layer comprises organo-silicate glass material.

13. The method of claim 1, wherein the dielectric layer comprises organo-silicate glass material.

14. The method of claim 13, wherein removing polymer from sidewalls comprises creating a plasma in a plasma cleaning chamber using a gas free of nitrogen and exposing the wafer to the plasma in th plasma gas. chamber, the gas comprising at least about 40% hydrogen, or a hydrogen-containing gas.

15. The method of claim 14, wherein the gas comprises about 60% hydrogen and about 40% argon.

16. The method of claim 14, wherein performing the etch-stop etch process comprises performing an RIE etch In an etch chamber, further comprising transferring the wafer from the etch chamber to the plasma cleaning chamber after the etch-stop etch process and before removing the polymer.

17. The method of claim 14:
wherein the wafer comprises a conductive feature formed over a substrate, a lower etch-stop layer formed of silicon carbide material over the conductive feature, a lower dielectric layer farmed of organo-silicate glass material over the lower etch-stop layer, an upper etch-stop layer formed over the lower dielectric layer, an upper dielectric layer formed over the upper etch-stop layer, and a hard mask layer formed over the upper dielectric layer;
wherein forming the cavity comprises etching a via through first portions of the hard mask layer, the upper dielectric layer, the upper etch-stop layer, and the lower dielectric layer to expose a first portion of the tower etch-stop layer in a prospective via region of the wafer, and etching a trench through second portions of the hard mask layer and the upper dielectric layer to expose a second portion of the upper etch-stop layer in a prospective trench region of the wafer; and
wherein performing the etch-stop etch process comprises removing the exposed first portion of the lower etch-stop layer to expose the portion of the conductive feature in the prospective via region.

18. The method of claim 17, further comprising forming a barrier layer in the cavity, filling the cavity with conductive material, and planarizing the wafer following removal of the polymer from the sidewalls.

19. The method of claim 14, wherein removing polymer from sidewalls comprises creating the plasma and exposing the wafer to the plasma in the plasma cleaning chamber for about 20 seconds or more and about 40 seconds or less using a gas flow rate of about 3000 sccm or more and about 4000 sccm or less, a chamber temperature of about 250 degrees C., and a pressure of about 0.5 torr or more and about 1.0 torr or less.

20. A method of removing polymer from a cavity during formation of Interconnect structures in the manufacture of a semiconductor wafer, the method comprising:
etching an exposed portion of an etch-stop layer in the cavity in a first process chamber to expose a portion of a conductive feature underlying the etch-stop layer; and
removing polymer from sidewalls in the cavity in a second process chamber using a plasma comprising hydrogen and one of the following gases: argon, helium, neon, or xenon.

21. The method of claim 20, wherein the plasma comprises about 60% hydrogen or other hydrogen-containing gas and about 40% of argon, helium, neon, or xenon.

22. The method of claim 21, wherein removing polymer from sidewalls comprises creating the plasma and exposing the wafer to the plasma in a plasma cleaning chamber for about 20 seconds or more and about 40 seconds or less using a gas flow rate of about 3000 sccm or more and about 4000 sccm or less, a chamber temperature of about 250 degrees C., and a pressure of about 0.5 torr or more and about 1.0 torr or less.

23. A method of cleaning polymer from a cavity in a dual damascene interconnect structure of a semiconductor wafer, comprising;
placing the wafer in a plasma cleaning chamber; and
exposing the wafer to a plasma comprising hydrogen or other hydrogen-containing gas and one of argon, helium, neon, and xenon in the plasma cleaning chamber.

24. The method of claim 23, wherein exposing the wafer comprises:
creating the plasma in the plasma cleaning chamber using a nitrogen-free gas comprising about 60% hydrogen and about 40% argon; and
exposing the wafer to the plasma in the plasma cleaning chamber for about 20 seconds or more and about 40 seconds or less using a gas flow rate of about 3000 sccm or more and about 4000 sccm or less, a chamber temperature of about 250 degrees C., and a pressure of about 0.5 torr or more and about 1.0 torr or less.

25. A method of cleaning polymer from a cavity in a single damascene interconnect structure of a semiconductor wafer, comprising:
placing the wafer in a plasma cleaning chamber; and
exposing the wafer to a plasma comprising hydrogen or other hydrogen-containing gas and one of argon, helium, neon, and xenon in the plasma cleaning chamber.

26. The method of claim 25, wherein exposing the wafer comprises:
creating the plasma in the plasma cleaning chamber using a nitrogen-free gas comprising about 60% hydrogen and about 40% argon; and exposing the wafer to the plasma in the plasma cleaning chamber for about 20 seconds or more and about 40 seconds or less using a gas flow rate of about 3000 sccm or more and about 4000 sccm or less, a chamber temperature of about 250 degrees C., and a pressure of about 0.5 torr or more and about 1.0 torr or less.

27. A method of cleaning polymer from a cavity in a semiconductor wafer, comprising:
performing an etch process which leaves polymeric residue in a cavity in the wafer; and
exposing the wafer to a plasma comprising hydrogen or other hydrogen-containing gas and one of argon, helium, neon, and xenon to remove at least a portion of the polymeric residue from the cavity.

28. The method of claim 27, wherein exposing the wafer comprises creating the plasma using a nitrogen-free gas comprising about 60% hydrogen and about 40% argon and exposing the wafer to the plasma for about 20 seconds or more and about 40 seconds or less using a gas flow rate of about 3000 sccm or more and about 4000 sccm or less, a chamber temperature of about 250 degrees C, and a pressure of about 0.5 torr or more and about 1.0 torr or less.

* * * * *